(12) United States Patent
Shah (10) Patent No.: US 9,960,249 B2
(45) Date of Patent: *May 1, 2018

(54) SEMICONDUCTOR HETEROBARRIER ELECTRON DEVICE AND METHOD OF MAKING

(71) Applicant: U.S. Army Research Laboratory ATTN: RDRL-LOC-I, Washington, DC (US)

(72) Inventor: Pankaj B Shah, Rockville, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 239 days.

This patent is subject to a terminal disclaimer.

(21) Appl. No.: 14/801,919

(22) Filed: Jul. 17, 2015

(65) Prior Publication Data
US 2015/0325676 A1 Nov. 12, 2015

Related U.S. Application Data

(62) Division of application No. 13/462,935, filed on May 3, 2012.

(51) Int. Cl.
| | |
|---|---|
| *H01L 29/66* | (2006.01) |
| *H01L 21/02* | (2006.01) |
| *H01L 29/93* | (2006.01) |
| *H01L 29/04* | (2006.01) |
| *H01L 29/20* | (2006.01) |
| *H01L 29/205* | (2006.01) |

(52) U.S. Cl.
CPC .... *H01L 29/66174* (2013.01); *H01L 21/0254* (2013.01); *H01L 29/045* (2013.01); *H01L 29/2003* (2013.01); *H01L 29/205* (2013.01); *H01L 29/93* (2013.01)

(58) Field of Classification Search
CPC ... H01L 29/93; H01L 29/045; H01L 21/0254; H01L 29/205; H01L 29/66174; H01L 29/2003
USPC .................................................. 438/379, 478
See application file for complete search history.

(56) References Cited

U.S. PATENT DOCUMENTS

| | | | |
|---|---|---|---|
| 8,674,372 B2 | 3/2014 | Curatola et al. | |
| 2009/0065810 A1* | 3/2009 | Honea | H01L 27/0605 257/192 |
| 2010/0072485 A1* | 3/2010 | Suda | B82Y 20/00 257/77 |

* cited by examiner

*Primary Examiner* — Hrayr A Sayadian
(74) *Attorney, Agent, or Firm* — Lawrence E. Anderson (57) ABSTRACT

A method of substantially offsetting polarization charges in an electronic device having a heterobarrier comprising providing a substrate; providing at least one pair of stacks of semiconductor materials; one of the pair of stacks having one or more of spontaneous and piezoelectric polarity where the total polarization charge is opposite to the other of the pair of stacks; whereby due to the opposing polarities, the polarization is balanced and the pair of stacks operate to store electrical energy.

20 Claims, 11 Drawing Sheets

Figure 6, direction of polarization charges in the layers. $P_{sp}$ is spontaneous polarization vector, $P_{pz}$ is the piezoelectric polarization vector, and $\sigma$ is the resulting polarization charge at the interface

Figure 7, plots of nonlinear capacitances showing its symmetric nature about V=0

Figure 8, Current-voltage plots showing its antisymmetric nature about V=0

SEMICONDUCTOR HETEROBARRIER ELECTRON DEVICE AND METHOD OF MAKING

CROSS REFERENCE TO RELATED APPLICATIONS

This application is a divisional application of and claims priority to U.S. patent application Ser. No. 13/462,935 entitled "Semiconductor Heterobarrier Electron Device and Method of Making," filed May 3, 2012.

STATEMENT OF GOVERNMENT INTEREST

The embodiments herein may be manufactured, used, and/or licensed by or for the U.S. Government without the payment of royalties thereon.

BACKGROUND OF THE INVENTION

The present invention relates to electronic devices having heterojunction interfaces. A heterostructure or heterojunction interface or refers to a region or interface that occurs at the junction between two different semiconductor crystal materials. The present invention is directed to heterostructure devices such as, for example, varactors. Varactors, as defined in Wikipedia (also referred to as varicap diodes, varactor diodes, variable capacitance diodes, variable reactance diodes or tuning diodes) are a type of diode which have a variable capacitance that is a function of the voltage impressed on their terminals. U.S. Pat. No. 5,422,613 to Nativ, hereby incorporated by reference, discloses an integrated varactor diode frequency multiplier assembly. Another example of a varactor is described in the publication by Tanuma, N, "Capacitance Analysis of Al0.25Ga0.75N/GaN Heterostructure Barrier Varactor Diodes," Phys. Stat. Sol. (c) 2, No. 7, 2692-2695 (2005) (hereinafter Tanuma)(hereby incorporated by reference). The varactor of Tanuma appears to require a voltage bias as explained in Section 2 of Tanuma where it states:

The calculated C-V and I-V characteristics in the presence and absence of the piezoelectric field are compared in FIG. 1. The C-V characteristics shift to a lower bias voltage due to the piezoelectric field induced by both the spontaneous polarization in GaN and AlGaN and the stress-induced field within the barrier.

Tanuma shows as the solid line in FIG. 1, the CV curve of a GaN/AlGaN varactor. The solid lithe reveals a shift away from V=0 due to the polarization charges induced at the surfaces of the AlGaN layer.

In the following the terminology Group 13 (IUPAC) and Group III refer to the same group of elements. The Group 13 group comprises boron (B), aluminum (Al), gallium (Ga), indium (In), thallium (TI, and ununtrium (Uut); each of which has three electrons in their outer valence levels.

SUMMARY OF THE INVENTION

A preferred embodiment of the present invention is an electronic device comprising a substrate; a pair of stacks of polar semiconductor materials which-create a charge by spontaneous and/or piezoelectric polarization; one of the pair of stacks having a total polarity which is in a direction opposite to the other of the pair of stacks; whereby due to the opposing polarities, the polarization is balanced. For example, the device may take the form of a varactor. The device may further comprise a pair of electrical contacts.

Also, in a preferred embodiment, one of the pair of stacks may be N-polar and while the other is Group 13-polar, with the stacks being spaced apart from each other. The N-polar and Group 13-polar stacks may each comprise at least two Group 13-N layers having a barrier layer therebetween; whereby the N-polar and G-polar stacks operate to store electrical energy.

The present invention may be practiced as a method of substantially eliminating the bias required to offset polarization charges in an electronic device having a heterobarrier comprising providing a substrate; growing at least one pair of stacks of semiconductor materials; one of the pair of stacks having a spontaneous polarity which is opposite to the other of the pair of stacks; whereby due to the opposing polarities, the polarization is balanced to substantially eliminate the need for a voltage bias. The method may be used to make a varactor.

Although the invention is demonstrated with the application to a specific embodiment, such as for example, a varactor, this technique may be applied to other electronic device applications without departing from the scope of the invention.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as an object, layer, or region is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being"directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. For example, when referring first and second photons in a photon pair, these terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that is farthest away from a substrate.

Embodiments of the present invention are described herein with reference to cross-section illustrations that are schematic illustrations of idealized embodiments of the present invention. Embodiments of the present invention should not be construed as limited to the particular shapes of regions illustrated herein but are to include deviations in shapes that result, for example, from manufacturing. The regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

Figure 2:
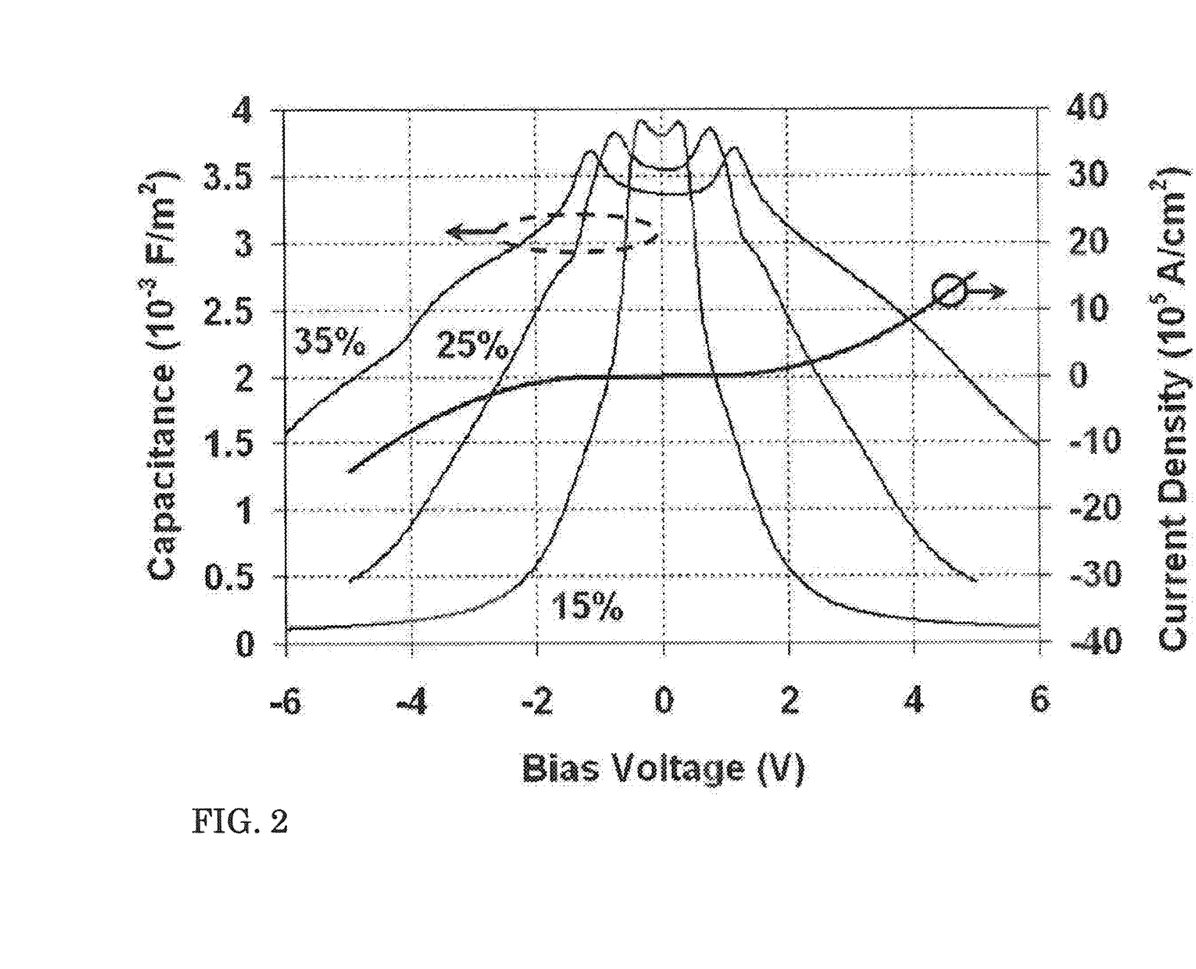
FIG. 2 is a graphical illustration of capacitance and current density plots for a preferred embodiment heterobarrier varactor diode. Percentages are Al composition of the AlGaN layer of FIG. 1. The current density curve corresponds to the 25% Al composition case.

A preferred embodiment of the present invention doesn't require a DC bias as revealed by the capacitance curves in FIG. 2 which are symmetrical about V=0. Because of symmetrical capacitance curves relative to V=0, the circuit design is simplified and is more efficient since one doesn't need an additional bias to shift the CV curve so that it is symmetric about V=0.

A preferred embodiment may take the form of a heterobarrier varactor (HBV) structure comprising two parallel GaN/AlGaN/GaN columns, one with Ga-polar growth and one with N-polar growth to balance polarization induced heterointerface charges, which can exhibit a symmetric capacitance voltage (C-V) plot, and hence, not require a biasing voltage. Heterobarrier varactors (HBVs) exhibit a nonlinear C-V characteristic that generates harmonics, and when operated as a reactive multiplier the conversion efficiency can reach 1 (or substantially almost 100% efficiency). To achieve optimal efficiency, heterobarrier varactors should exhibit a symmetric capacitance-voltage (C-V) curve and an antisymmetric current voltage (I-V) curve. This type of structure generates no $2^{nd}$ harmonic under RF excitation without a DC bias, and therefore no idlers are needed at that frequency. A further description can be found in M. Krach, J. Freyer, and M. Claassen, "Power generation at millimeterwave frequencies using GaAs/OaAIAs triplers," Phys. Stat. Sol., (c), 1, 2160 (2004) and L. Dillner, W. Strupinski, S. Hollung, C Mann, J. Stake, M. Beardsley, and E. Kollberg, "Frequency multiplier measurements on heterostructure barrier varactors on a copper substrate," IEEE Elect. Dev. Lett., 21, 206 (2000), both of which are hereby incorporated by reference as though fully rewritten herein.

To achieve high frequencies, the Group 13-nitride material system is considered suitable due to the material's ionic nature, which leads to strong electron-LO phonon coupling. A phonon is a collective excitation in a periodic, elastic arrangement of atoms or molecules in solids and some liquids; i.e., a quasiparticle, that represents an excited state in the quantum mechanical quantization of the modes of vibrations of such interacting particles. The strong electron-LO phonon coupling, results in fast electron cooling by LO phonon emission, in what is known as the Fröhlich interaction (as further described in X. B. Zhang, T. Taliercio, S. Kolliakos, and P. Lefebvre, "Influence of electron-phonon interaction on the optical properties of III nitride semiconductors", J. Phys. Condens. Matter, 13, 7053, (2001)(hereby incorporated by reference), so that hot electrons occur at frequencies much higher than in other material systems and electron transfer from the lower Γ valley to the upper L and X valleys through hot electron intervalley scattering is minimized. In these upper valleys, the mobility and subsequently the drift velocities are lower. The Fröhlich interaction is a Coulomb interaction between electrons and the longitudinal electric field produced by the LO phonons. The electron-to-LO phonon emission rate in gallium nitride (GaN) is roughly 100 fs: A further description of this concept may be found in G. Xu, S. K. Tripathy, X. Mu, Y. J. Ding, K. Wang, Yu. Cao, D. Jena and J. B. Khurgin, "investigation of hot electrons and hot phonons generated within an AlN/GaN high electron mobility transistor", Laser Physics, 19, 745 (2009). Also, the high LO phonon emission rate minimizes electron thermionic emission over the heterobarrier. The high LO phonon emission rate, along with higher drift velocities—GaN peak drift velocity ~2.9×10$^7$ cm/s and saturation drift velocity ~2.5×10$^7$ cm/s—and greater band offsets at heterobarriers, makes the III-nitride system a good choice for high frequency applications.

Heterobarrier varactors have been investigated in the AlGaN/GaN system (see in this regard N. Tanuma, S. Yokokura, T. Matsui, and M. Tacano, "Capacitance analysis of Al0.25Ga0.75N/GaN heterostructure barrier varactor diodes" Phys. Stat. Sol., (c), 2, 2692 (2005) and M. Saglam, K. Mutamba, A. Megej, C. Sydlo, and H. L. Hartnagel, "Influence of polarization charges in Al0.4Ga0.6N/GaN barrier varactors", Appl. Phys. Lett., 82, 227, (2003) (both of which are hereby incorporated by reference)) and the GaN/indium nitride (InN) system (see in this regard A. Reklaitis, "Terahertz-frequency InN/GaN heterostructure-barrier varactor diodes", J. Phys.: Condens. Matter, 20, 384202, (2008) (hereby incorporated by reference)), but the observed C-V plots exhibited nonsymmetric bias dependence due to the spontaneous and piezoelectric polarization induced sheet charges at the heterointerfaces. The present invention is directed to a new heterobarrier varactor device structure that accounts for polarization effects and exhibits a symmetric C-V plot at zero bias. This is advantageous because the circuit design is simplified and is more efficient since one doesn't need an additional bias to shift the CV curve so that it is symmetric about V=0.

Figure 1:
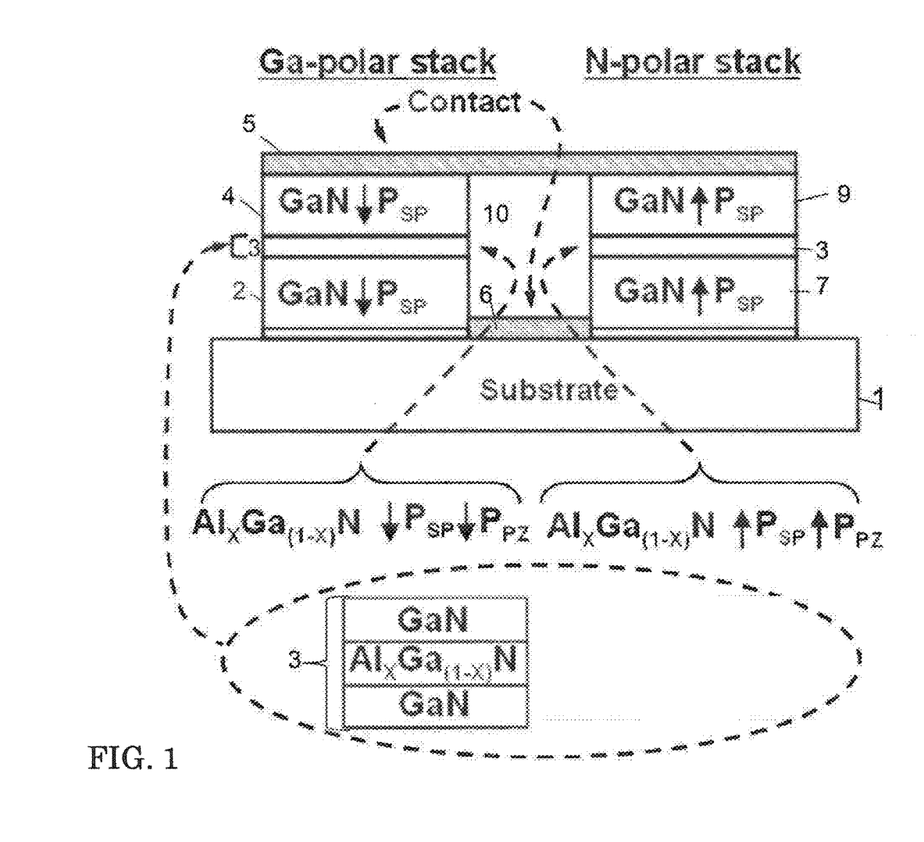
FIG. 1 illustrates schematically the structure that comprises two columns of GaN/AlGaN/GaN that share the top and bottom contacts.

FIG. 1 illustrates schematically the structure that comprises two columns of GaN/AlGaN/GaN that share the top and bottom contacts 5, 6; spaced apart by a region 10. As shown in FIG. 1, the left column comprises a layer 2 of GaN, layer 3 (shown in an enlarged view at the bottom of FIG. 1 comprising an inner layer of AlxGa(1−x)N, and a layer 4 of GaN. Layer 3 comprises GaN "out" regions which are included due to the epitaxial growing process (slowly ramps to AlGaN growth). The left column comprises a layer 7 of GaN, layer 3 (shown in an enlarged view at the bottom of FIG. 1 comprising an inner layer of AlxGa(1−x)N, and a layer 9 of GaN. In this preferred embodiment, the layer 3 in the right column is the "flipped version" or inverted equivalent of the layer 3 in the left column. The layers 4 and 9 may be, for example, in the range of 5 nm to 1500 nanometers thick, as for example, approximately 600 nm. The layers 3 may be formed of an undoped GaN layer approximately 5 nm thick, a AlxGa(1−x)N layer approximately 5 nm thick, and an undoped GaN layer approximately 5 nm thick. The layers 2 and 7 may be, for example, in the range of 5 nm to 1500 nanometers thick, as for example approximately 800 nm. The right column is nitrogen (N)-polar the left is gallium (Ga)-polar in order to balance the polarization charges at the interfaces and make the C-V plot symmetric about V=0. See in this regard O. Ambacher, J. Smart, J. R. Shealy, N. G. Weimann, K. Chu, M. Murphy, W. J. Schaff, L. F. Eastman, R. Dimitrov, L. Wittmer, M. Stutzmann, W. Rieger, and J. Hilsenbeck, "Two-dimensional electron gases induced by spontaneous and piezoelectric polarization charges in N- and Ga-Face AlGaN/GaN heterostructure", J. Appl. Phys., 85 3222 (1999), hereby incorporated by reference. Growing these two structures (Ga-polar and N-polar stacks) adjacently on one wafer had been demonstrated with proper buffer layer surface treatment and annealing. See in this regard R Collazo, S. Mita, A. Aleksov, R. Schlesser, and Z. Sitar, "Growth of Ga- and N-polar gallium nitride layers by metalorganic vapor phase epitaxy on sapphire wafers", Journal of Crystal Growth, 287, 586 (2006) (hereby incorporated by reference). The AlGaN barrier region is surrounded by undoped GaN layers 5 nm thick, as shown in the bottom of FIG. 1. With this structure, drift-diffusion simulations were run using the Silvaeo-Blaze device simulation software. Concentration and field dependent mobility models were used. Spontaneous and piezoelectric polarization charges were calculated and included for the heterointerfaces. See in this regard V. Fiorentini, F. Benardini, and O. Ambacher, "Evidence for nonlinear macroscopic polarization in III-V nitride alloy heterostructures" Appl. Phys. Lett., 80, 1204, (2002) (hereby incorporated by reference). The calculated charge values were scaled to 40% of the calculated polarization charges, as others have done, to account for 1) defect mitigated relaxation of the tensile stressed AlGaN that is lattice mismatched to the underlying GaN and 2) interface charges due to impurities. See in this regard Y-K Kuo, S-H Horng, S-H Yen., M-C Tsai and M-F Huang, "Effect of polarization state on optical properties of blue-violet InGaN light-emitting diodes," Appl. Phys. A., 98, 509 (2010). To accurately include the effects at the heterobarrier, the mesh was refined extensively at the heterobarriers. To obtain generation efficiency ratios of 3$^{rd}$ harmonic to fundamental, a Fourier transform was calculated of the time domain signal.

Note that although GaN is associated with FIG. 1, the two stacks may comprise different group III-nitride layers consisting of compounds (GaN, InN, or AlN), ternary alloys (either $Al_xGa_{(1-x)}N$, $InGa_{(1-x)}N$, or $Al_xIn_{(1-x)}N$ where 0<x<1), or quaternary alloys $(Al_xIn_yGa_{(1-x-y)}N$ where 0<x<1, 0<y<1, and 0<(x+y)<1). The substrate 1 may be either a group III-nitride compound or any other substrate that allows good epitaxial growth of the group III-nitride layers such as SiC, sapphire, or silicon. Both stacks may comprise a wide energy gap semiconductor barrier layer in between narrower energy gap semiconductor layers. All the materials mentioned above can be used for either layer as long as the barrier layer 3 comprises a wider energy gap material than the surrounding layers 2, 4 or 7, 9. Also one stack may be the "flipped over" equivalent of the other.

Non-centrosymmetric compound crystals (crystals that lack inversion symmetry) such as the wurtzite crystal structure exhibit a type of chemical polarity known as spontaneous polarization. The origin of spontaneous polarization can be understood as follows. For a binary A-B compound in the wurtzite crystal structure the sequence of the layer of A atoms and the layer of B atoms in what is known as a bilayer are reversed in the two opposite growth directions, [0001] and [000-1], along the crystal's c axis. The corresponding faces (0001) and (000-1) are known as the A and B faces, and the c axis is an axis perpendicular to the hexagonal planes. A bilayer consists of two closely spaced layers, one formed by cations (metal such as Ga) and the other formed by anions (such as N). Because the cations and anions are different, there is a separation of charge in the bilayer leading to a spontaneous polarization in the bulk material with a direction defined by the faces. The idea is similar for ternary and quaternary alloys. With a lattice mismatch to the underlying crystalline layer during growth a coherently strained and perhaps slightly relaxed layer is introduced and therefore the epitaxially grown layer also exhibits piezoelectric polarization. Since both spontaneous and piezoelectric polarization both contribute to the total polarization, both have to be summed for the total polarization in each stack.

FIG. 2 shows the symmetric C-V plots and antisymmetric I-V plot of AlGaN/GaN heterobarrier varactors for different barrier aluminum compositions. The layers were assumed to be grown and doped so that the AlGaN layer had $1\times10^{17}$ cm$^{-3}$ free electrons and the outer two GaN layers had $1\times10^{19}$ cm$^{-3}$ free electrons. These concentrations gave large $C_{max}/C_{min}$ ratios, which is a metric related to cutoff frequency. The C-V plot is a composite of two shifted C-V peaks due to the two columns in FIG. 1 with oppositely directed polarization vectors. The high free electron concentration in the GaN layer leads to large leakage as observed at 3 V. This concentration gave, for the 25% aluminum heterobarrier varactor, a current 405 times that if the free electron concentration in the outer GaN regions were $1\times10^{18}$ cm$^{-3}$. As mentioned previously, the shape of the C-V curve is important and it is partly controlled by doping. Reducing the doping-so that the free electron concentration in the GaN layer is $1\times10^{18}$ cm$^{-3}$ for the 0.25% AlGaN heterobarrier varactor reduces $C_{max}$ to 0.56 times that shown in the figure, and increasing the electron concentration in the AlGaN layer to $1\times10^{18}$ cm$^{-3}$ causes $C_{max}$ to increase about 7%.

Figure 3:
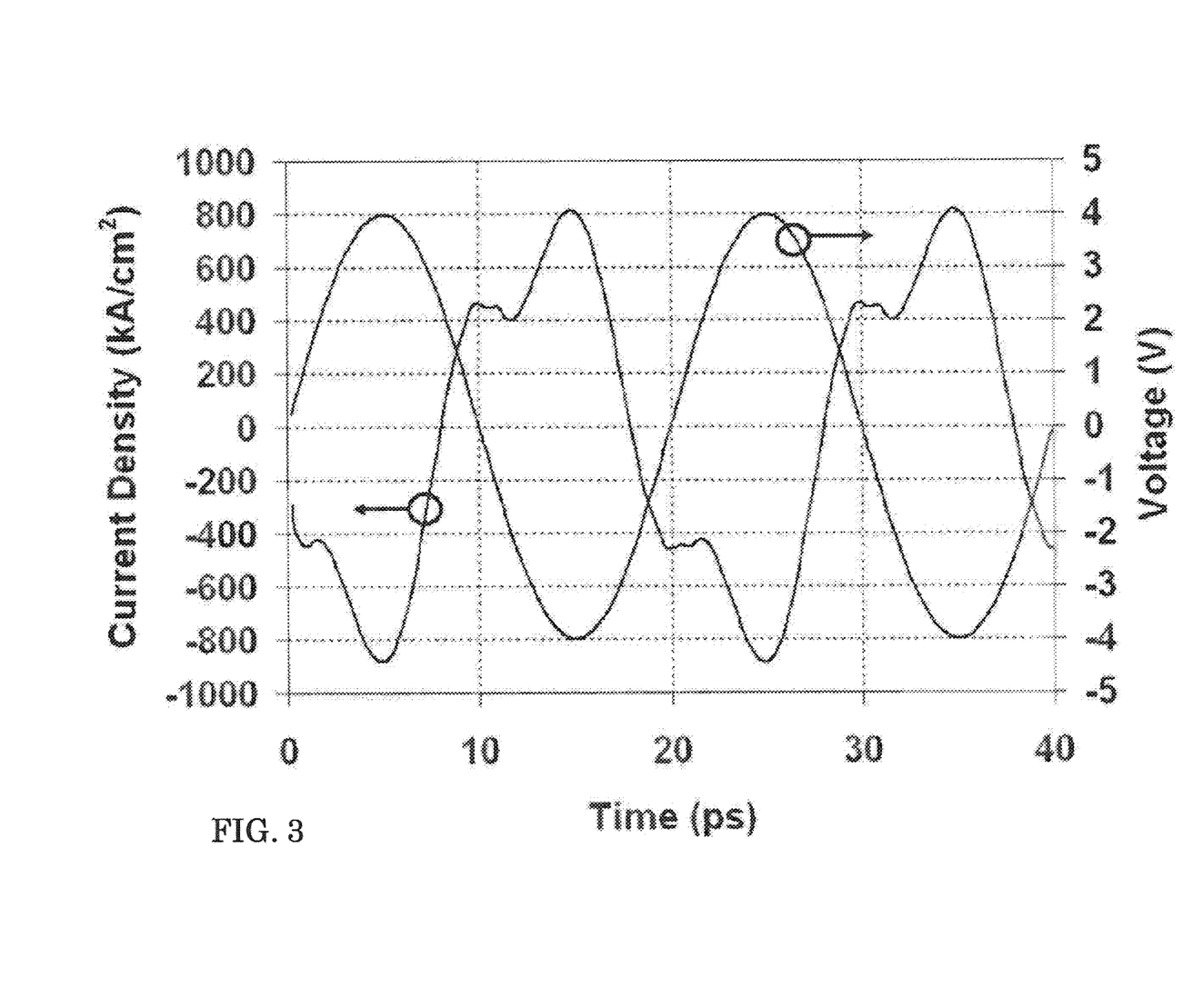
FIG. 3 is a graphical illustration showing the current density resulting from the 50-GHz bias voltage applied across the 25% composition AlGaN/GaN Heterobarrier varactor shown in FIG. 2.
Figure 4:
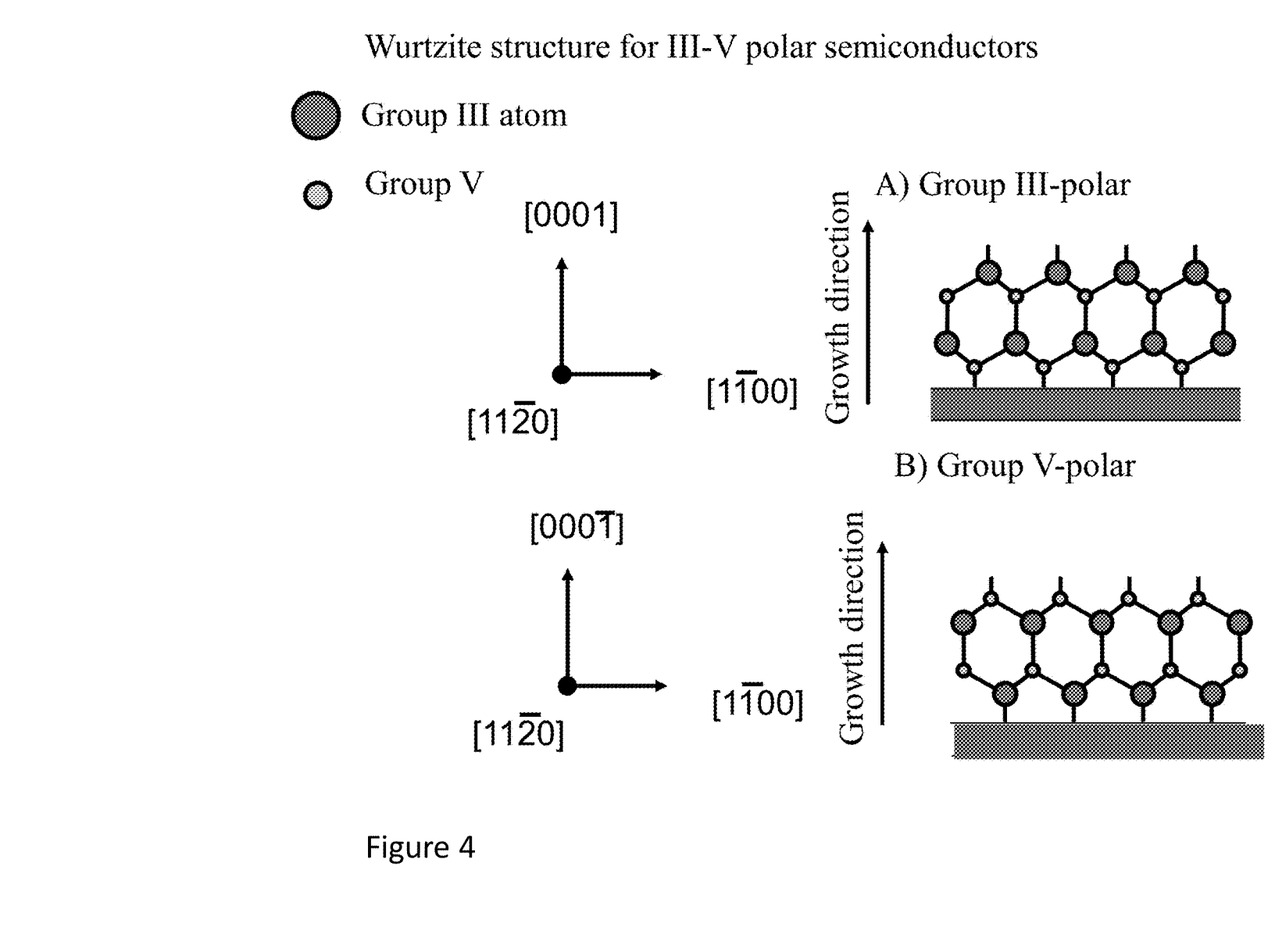
FIG. 4 is a schematic illustration illustrating the concept of polarity with respect to Group 13 (aka Group III) polar and Group 5 polar growth of crystals.
Figure 5A:
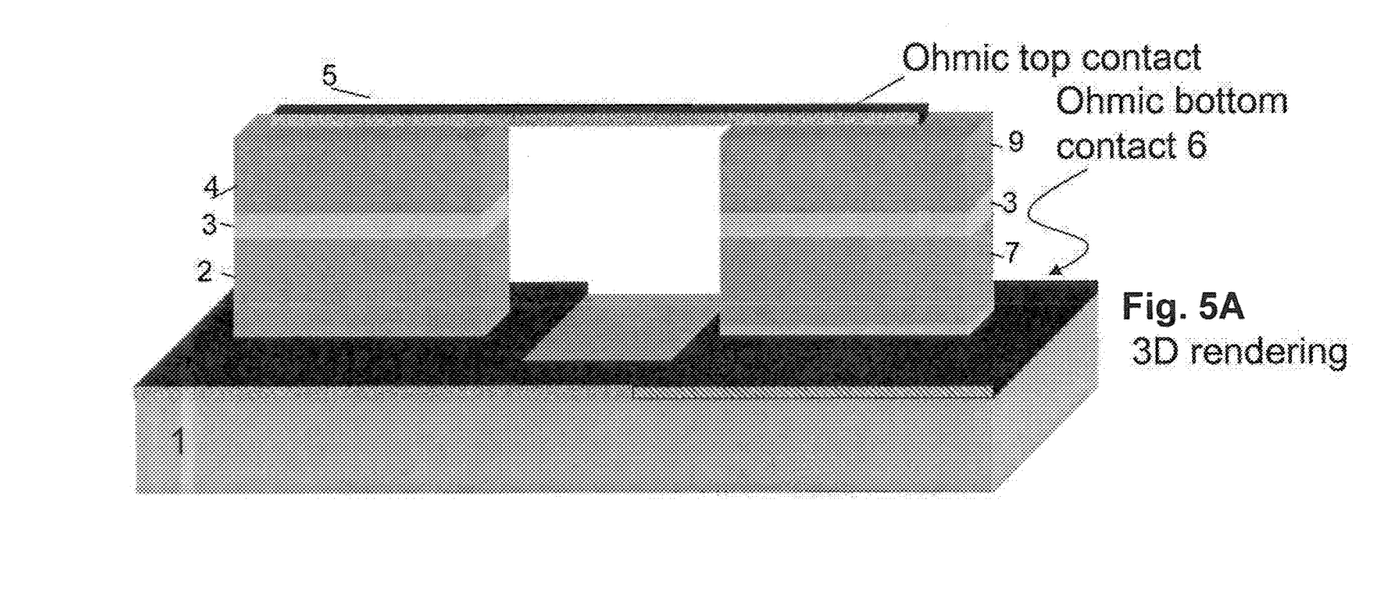
FIG. 5A is an illustration showing a three dimensional schematic of a preferred embodiment.
Figure 5B:
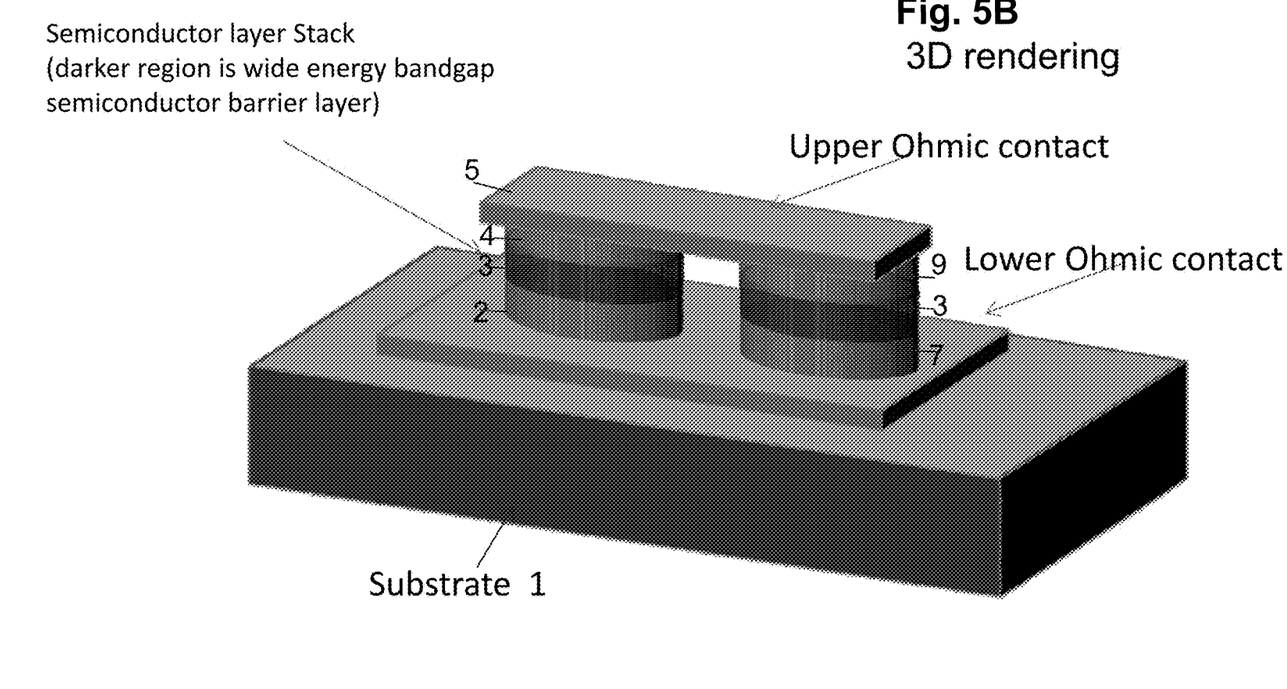
FIG. 5B is an illustration showing a three dimensional schematic of a preferred embodiment.

With a 4-V peak sinusoid applied, the conversion ratio of 3rd harmonic (150 GHz) to fundamental (50 GHz) are J3/J1=0.16 (for X=15%), J3/J1=0.323 (for X=25%) and J3/J1=0.048 (for X=35%). The high leakage at the heterobarrier is the major reason for the low conversion efficiency of the X=15% case. FIG. 3 shows the transient behavior of the 25% composition device represented in FIG. 2. The transient current has an uneven shape due to the presence of a local minimum and two maximums in the C-V curve rather than just one maximum. The numerical data in both FIGS. 2 and 3 are within the ranges calculated for InN/GaN. For a further discussion of this concept see A. Reklaitis, "Terahertz-frequency InN/GaN heterostructure-barrier varactor diodes", J. Phys.: Condens. Matter, 20, 384202, (2008), hereby incorporated by reference.

Improved growth conditions or processing could affect device performance through reduced scaling of the heterobarrier interface charges, so performance was examined using this as a parameter. With 60% of the total charge present on each AlGaN/GaN interfaces, the ratio of 3rd harmonic to fundamental J3/J1 increases to 0.365 for a 4-V sinusoidal input at 50 GHz. With 80% of the total charge present on each AlGaN/GaN interface, J3/J1 is 0.409. J3/J1 results for the input sinusoidal signal at 100 GHz, X=0.25 heterobarrier varactor structure for 40% of the calculated polarization charge at each AlGaN/GaN interface, were J3/J1=0.24, for 60%, J3/J1=0.288, and for 80% J3/J1=0.263.

In summary, drift-diffusion numerical simulations have shown that a GaN/AlGaN/GaN heterobarrier varactor structure can exhibit a symmetric C-V characteristic about V=0 with reasonable efficiency (J3/J1=0.323) for 40% of the total calculated polarization charge at the heterobarrier interfaces. The symmetric behavior is achieved by paralleling N-polar and GA-polar stacks. Further optimization accounting for heat flow and phonon relaxation is needed since though there is fast LO phonon emission to relax the electrons, the LO phonon lifetime is still quite long and LO phonons can reduce the electron mobility and affect the carrier drift velocity. Adding Al to GaN reduces the hot phonon lifetimes, so it may be necessary to use an $Al_xGa_{(1-x)}N/Al_yGa_{(1-y)}N/Al_xGa_{(1-x)}N$ structure (with x<y) rather than a GaN/$Al_xGa_{(1-x)}$N/GaN structure, making sure that the hot phonon lifetimes in the narrow gap regions are short. See in this regard G. P. Srivastava, "The anharmonic phonon decay rate in group-III nitrides" J. Phys: Condens. Matter, 21, 174205 (2009), hereby incorporated by reference.

Figure 6:
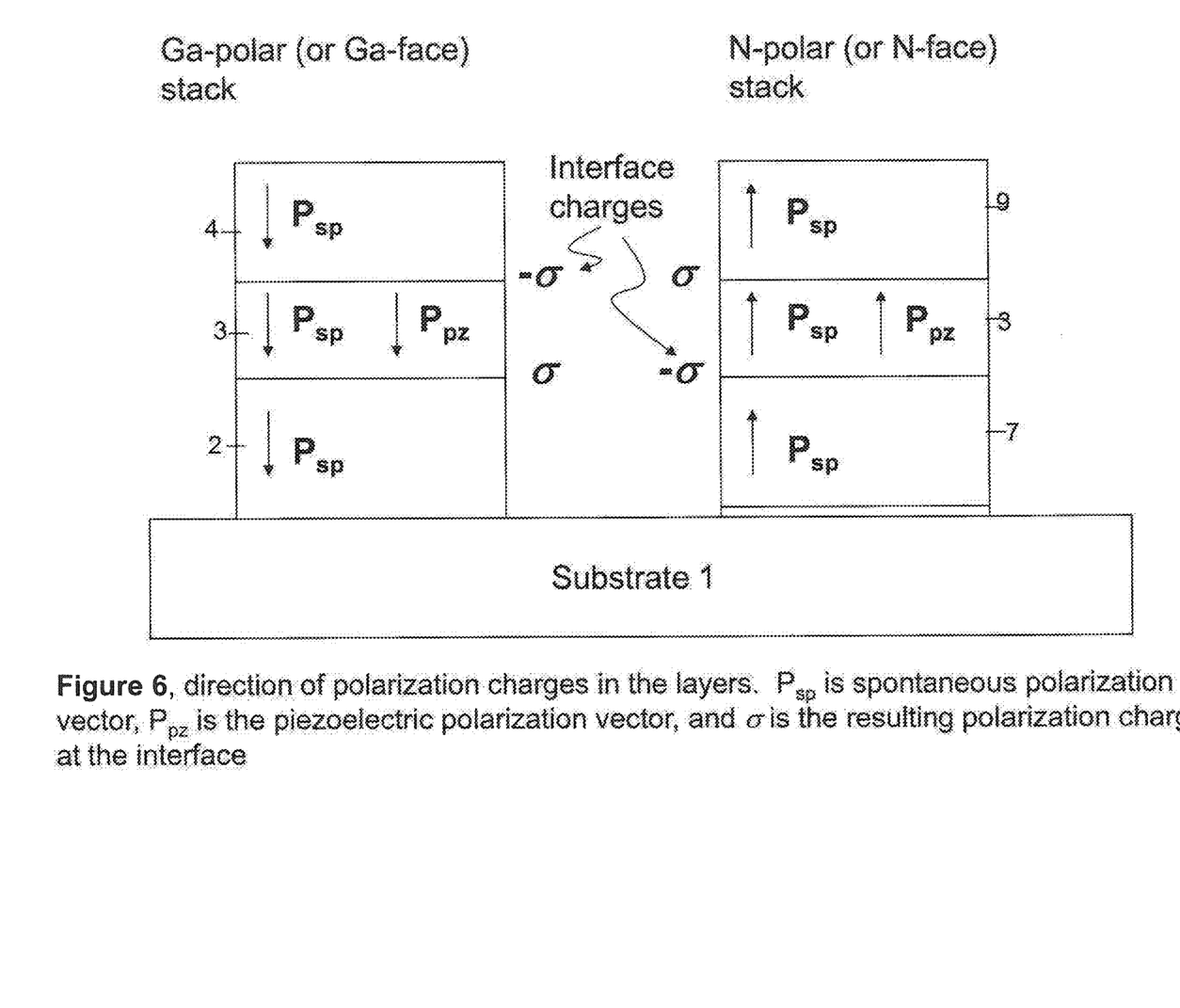
FIG. 6 is a schematic illustration depicting the direction of polarization charges in the layers, where Psp is spontaneous polarization vector, Ppz is the piezoelectric polarization vector, and o is the resulting polarization charge at the interface.

The present invention makes possible the generation of THz signals by tripling an input signal frequency of around 350 GHz (third harmonic generation). This invention improves upon the conventional heterobarrier varactor made from this or other semiconductor materials. Very high efficiencies for conversion of fundamental frequencies to third harmonic frequencies are possible. For instance a 100 GHz input signal can be upconverted to 300 GHz with an excellent conversion ratio J3/J1 of 28.8%. A conventional heterobarrier varactor exhibits a nonlinear reactance that leads to the generation of harmonics (including the third harmonic, 3ro) when a sinusoidal bias, of frequency ro is applied across the device. Also the current-voltage curves are antisymmetric so this makes the circuit design easier since there will be no second harmonic generation and therefore idlers are not required for the second harmonic. The issue with conventional heterobarrier varactors made of GaN or other III-nitride semiconductors is that due to the internal polarization charges of this pyroelectric material the nonlinear capacitance vs. voltage plot is shifted so that it is not symmetric about the zero voltage axis. This greatly reduces the efficiency of third harmonic generation. There are several advantages of making a varactor using the III-nitride material system including the fact that the peak steady-state drift velocity exceeds that of other semiconductor systems such as GaAs and the larger conduction band offset ensures better blocking of current over the heterobarrier compared to the GaAs material system. GaN is focused on for explanation purposes, but this can work for other III-nitride materials. GaN epilayers are grown using either the MOCVD or MBE method. It is possible depending on the growth conditions to obtain epilayers with gallium (Ga) atoms connected to a nitrogen (N) atom directly along and parallel to the growth direction. This is considered a Ga-face or Ga-polar material. If one obtains epilayers with N atoms connected to Ga atoms directly along and parallel to the growth direction the material is considered N-face or N polar. Growth of both Ga-polar and N-polar materials has been demonstrated on the same wafer as needed in this invention. The polarity determines the direction of the spontaneous and piezoelectric polarization vectors and the signs of the polarization charges at the interfaces between different the different III-nitride semiconductor materials. FIG. 6 illustrates the interface charges and polarization vectors of one embodiment of the invention. By combining the N-polar and Ga-polar regions into one structure with a common top and bottom electrode the effects of the interface charges are cancelled.\

Figure 7:
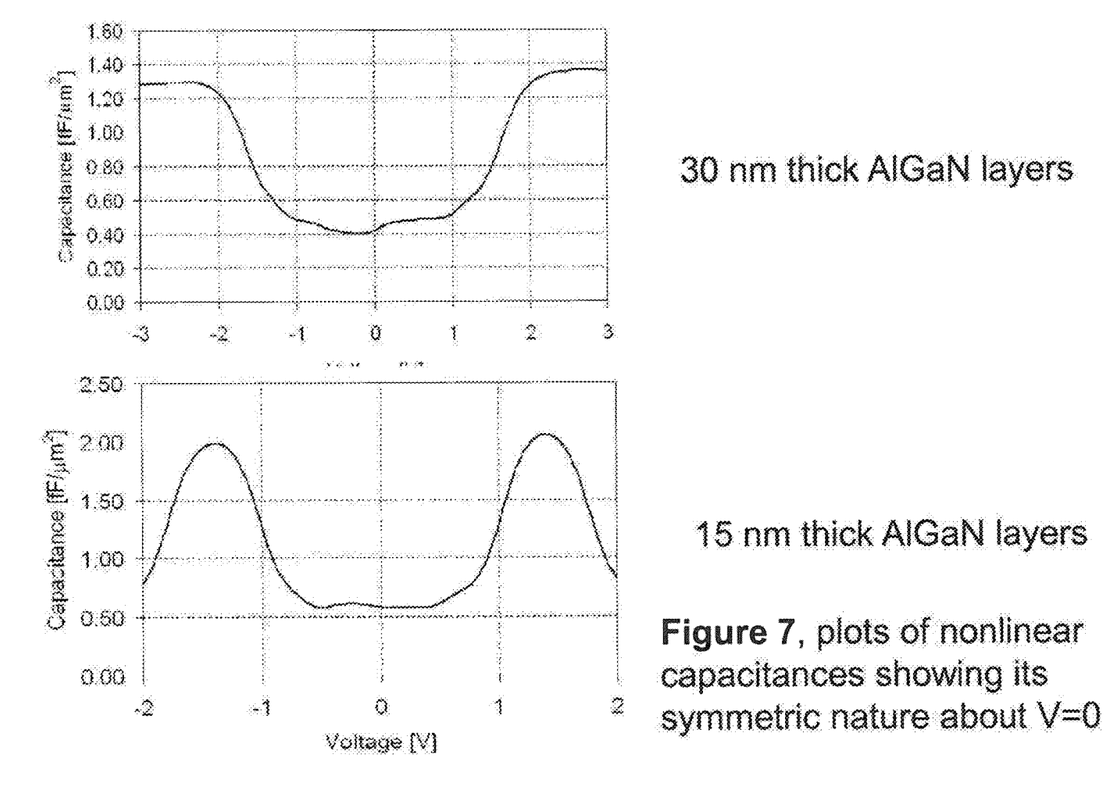
FIG. 7 is a graphical illustration of plots of nonlinear capacitances showing symmetric nature about V=0.
Figure 8:
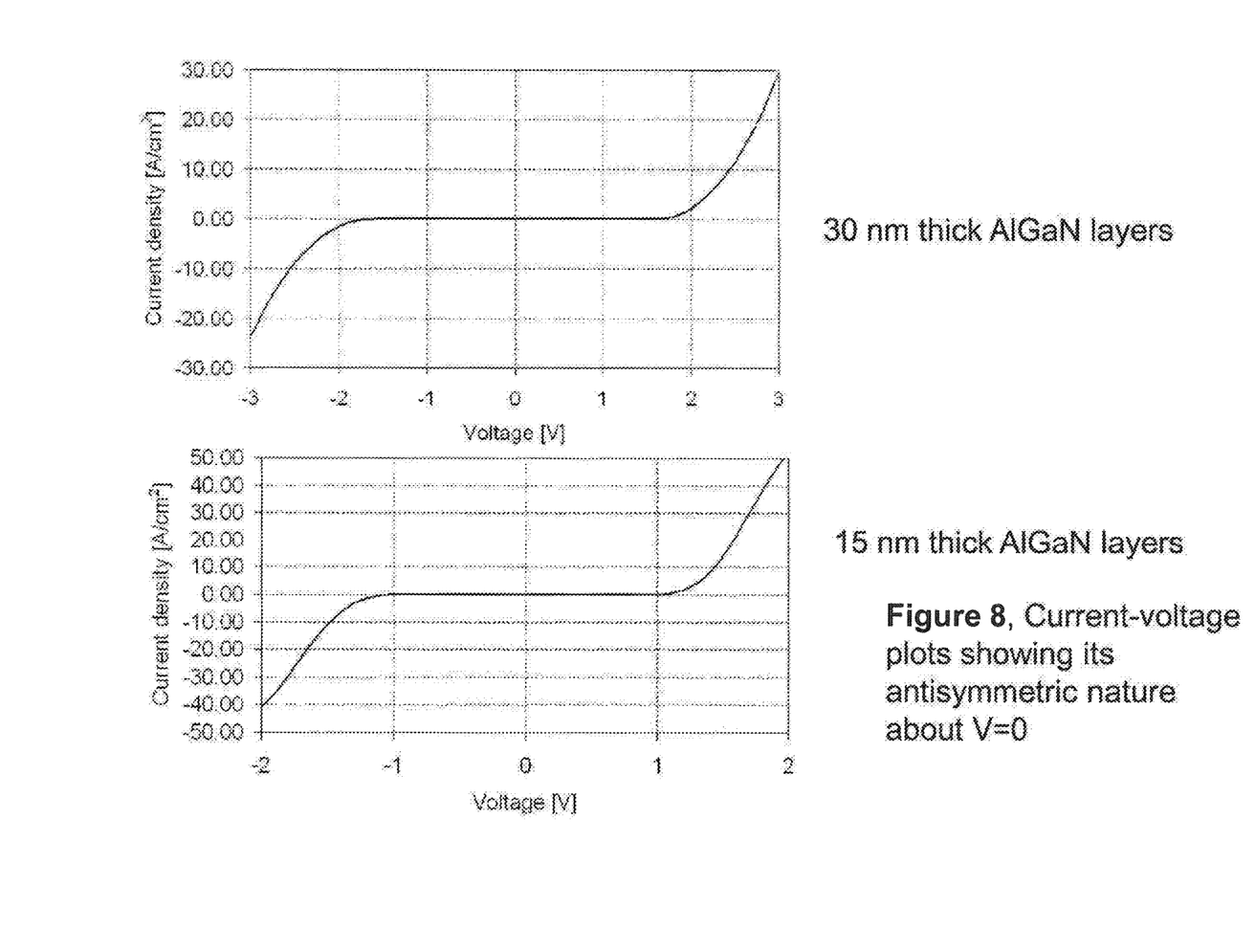
FIG. 8 is a graphical illustration of current voltage plots showing antisymmetric nature about V=0.
Figure 9:
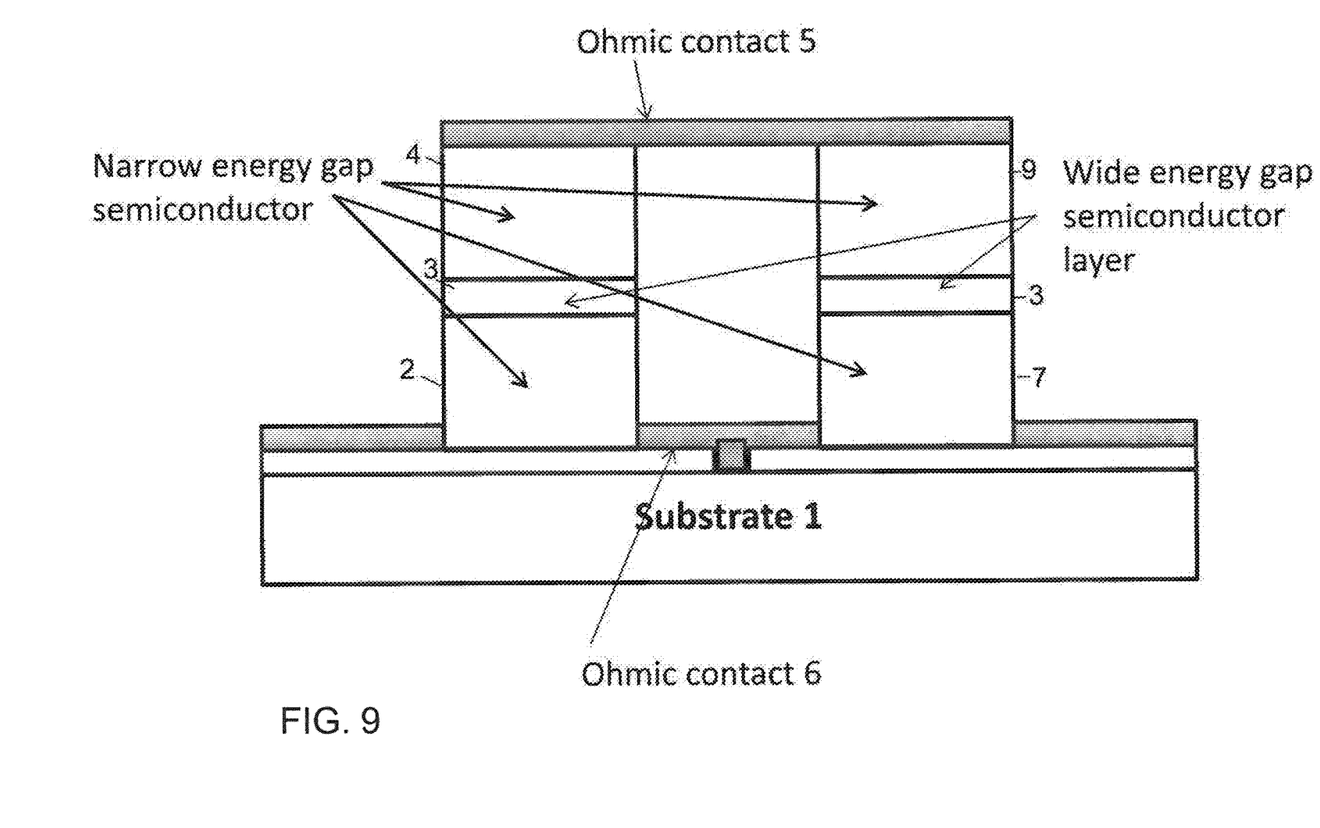
FIG. 9 is a schematic illustration showing the wide energy gap semiconductor layers 3 and narrow energy gap layers 2, 4, 7, 9.
Figure 10:
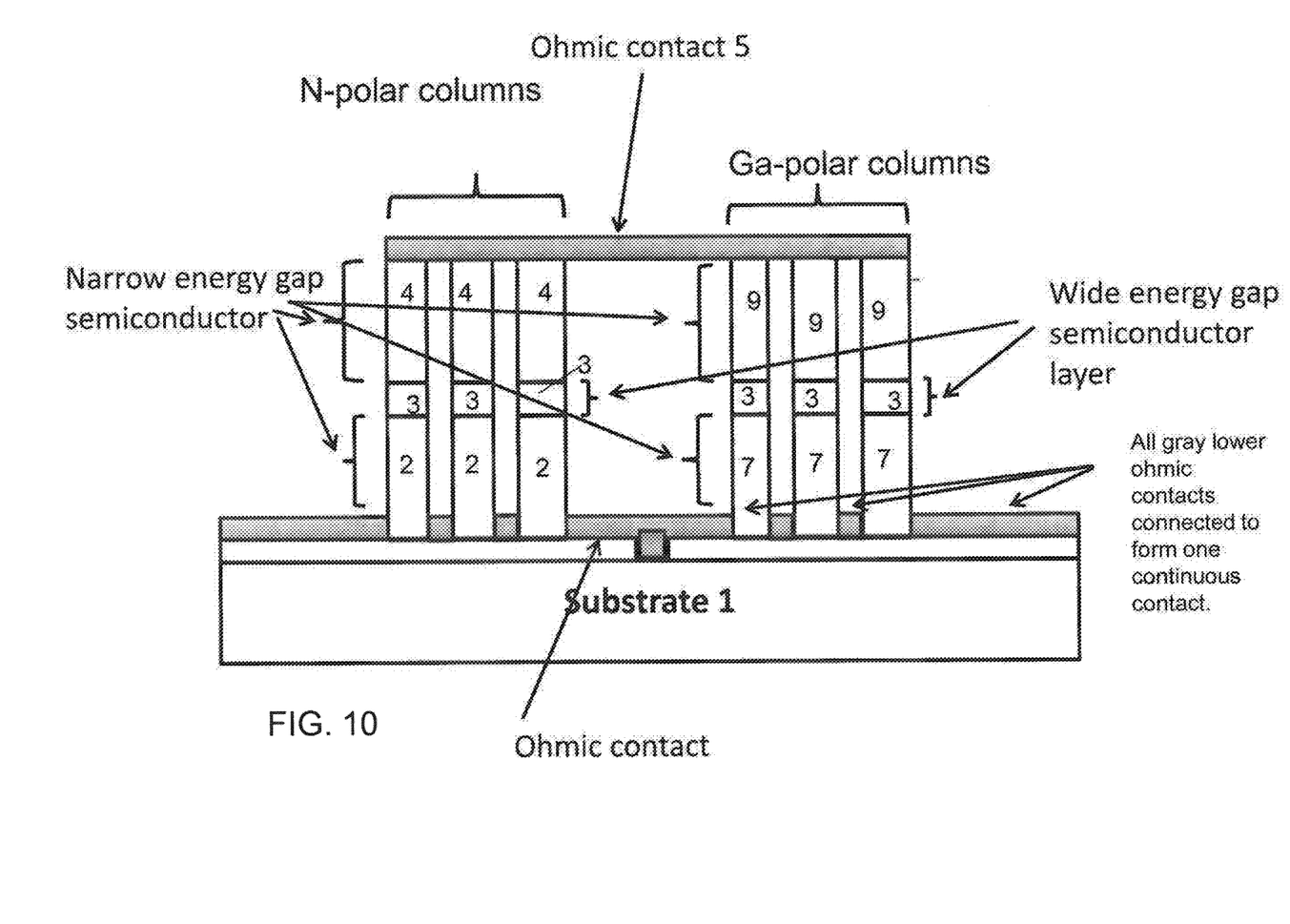
FIG. 10 is a schematic illustration of another preferred embodiment with a continuous or contiguous electrical contact.

In accordance with a preferred embodiment of the present invention, both Ga-polar and N-polar stacks of GaN/AlGaN/GaN may be grown on the same substrate in close proximity using appropriate buffer layers and growth conditions of either the MBE or MOCVD technique that is optimized for the appropriate Ga-polar and/or N-polar material. For instance, the Ga-polar material can be grown first, followed by proper region masking and etching of the Ga-polar material in certain regions and a growth of N-polar material using the appropriate material preparation and growth conditions. The bottom and top ohmic contacts are deposited by any common technique that allows creating an ohmic contact to the GaN layers after growth of the GaPolar and N-Polar stack. The top contacts are connected by using the usual air bridge technique. FIG. 7 exhibits simulation results showing the nonlinear capacitance-voltage results for one embodiment of the invention where the Al0.25Ga0.75N region is either 15 nm and 30 nm thick. This thickness is less than the critical thickness as calculated by others so that there is no relaxation and the polarization charges are that determined by spontaneous and piezoelectric polarizations as given by the equations of V. Fiorentini, et al. "Evidence for nonlinear macroscopic polarization in III-V alloy heterostructures", Appl. Phys. Lett., vol. 80, p. 1204, (2002), hereby incorporated by reference. Since AlGaN is grown on GaN it is in tensile and the piezoelectric charges are parallel to its spontaneous polarization charges. 40 percent of the calculated values of the interface charges were utilized as had been done by Y-K Kuo, et al. "Effect of polarization state on optical properties of blue-violet InGaN light-emitting diodes", Appl. Phys. A, vol. 98, p. 509, (2002), since the equations represent a perfect case where there is no interface charges due to defects or impurities and no other lattice imperfections in the GaN and AlGaN layers. The energy bandgap related information comes from Vurgaftman, J. R. Meyer, "Band Parameters for III-Y compound semiconductors and their alloys", Appl. Phys. Rev., vol. 89, p. 5815 (2001), hereby incorporated by reference. FIG. 8 demonstrates the important asymmetric nature of the current-voltage curves.

As used herein, the terminology "varactor" means a varicap diode, varactor diode, variable capacitance diode, variable reactance diode or tuning diode is a type of diode which has a variable capacitance that is a function of the voltage impressed on its terminals.

As used herein, the terminology "Group III" or "Group 13" (International Union of Pure and Applied Chemistry (IUPAC)) or the boron family of the periodic chart refers to one or more of the elements within Group 13 boron family of the periodic chart. The boron group comprises boron (B), aluminum (Al), gallium (Ga), indium (In), thallium (Tl), and ununtrium (Uut); each of which has three electrons in their outer valence levels.

As used herein the nitrogen group is a periodic table group consisting of nitrogen (N), phosphorus (P), arsenic (As), antimony (Sb), bismuth (Bi) and ununpentium (Uup).

The terminology "layer" as used in the following claims is not intended to be limiting; including as to size, shape or dimension. The "layer" as used in the claims may be part of a composite device composed of various layers or the "layer" may be a part of a uniform region. The terminology "layer" includes "region."

The terminology "stack" means a structure comprising "layers," The terminology "stack" as used in the following claims is not intended to be limiting; including as to size, shape or dimension.

The foregoing description of the specific embodiments are intended to reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

The invention claimed is:

1. A method of substantially offsetting polarization charges in an electronic device having a heterobarrier comprising the following steps, not necessarily in the following order:
   providing a substrate;
   providing at least one pair of stacks of semiconductor materials;
   one of the pair of stacks having one or more of spontaneous and piezoelectric polarity where the total polarization charge is opposite to the other of the pair of stacks;
   whereby due to the opposing polarities, the polarization is balanced and the pair of stacks operate to store electrical energy.

2. The method of claim 1 wherein the electronic device is a varactor.

3. The method of claim 1 wherein the balancing of the polarization substantially eliminates the need for a voltage bias and wherein the at least one pair of stacks are substantially parallel stacks.

4. The method of claim 1 wherein each of at least one pair of stacks comprises at least two layers of a narrow energy gap material surrounding a wide energy gap material, and wherein one of the pair of stacks is N-polar and the other is Ga polar.

5. The method of claim 4 wherein the Ga-polar stack and the N-polar stack comprise two substantially undoped Group III-nitride layers having a barrier layer therebetween and first and second electrical contacts operatively associated with the N-polar and Ga-polar stacks, whereby the N-polar and Ga-polar stacks operate to store electrical energy and the first and second electrical contacts provide for release of the electrical energy.

6. A method of making a semiconductor heterobarrier electronic device comprising the following steps, not necessarily in the following order:
   providing a substrate;
   providing a pair of stacked layers comprising Group III-nitride semiconductor materials selected from the group of compounds consisting of GaN, InN, AlN, $Al_xGa_{(1-x)}N$, $In_xGa_{(1-x)}N$, $Al_xIn_{(1-x)}N$, $Al_xIn_yGa_{(1-x-y)}N$, where $0<x<1$, $0<y<1$, and $0<(x+y)<1$;
   operatively connecting the stacks such that the polarity of one stack opposes the polarity of the other in the pair of stacks; the first of the pair of stacked layers comprising layers that are Group III-polar and the second of the pair comprising layers that are N-polar, the pair of stacked layers being configured such that the spontaneous and/or piezoelectric polarization attributable to the arrangement of the atoms of the materials in first of the pair of stacked layers opposes the spontaneous and/or piezoelectric polarization attributable to the arrangement of the atoms of the materials in the second of pair of stacked layers; the pair of stacked layers being positioned so as to provide electrical energy.

7. The method of claim 6 wherein the first of the pair of stacked layers is spaced apart by a distance in the range of approximately 5 nm to 2 centimeters from the second of the pair of stacked layers; each of the pair of stacked layers ending with a Group III polar surface on one end and an N-polar surface on the opposite end arranged so that the polarities of each of the stacked layers is opposite to the other.

8. The method of claim 6 wherein the step of operatively connecting the pair of stacked layers comprises providing at least one contact configured to connect the pair of stacked layers such that at least one contact interconnects the Group III-polar face of the first of the pair of stacked layers with the N-polar of the second of the pair; and wherein the pair of stacked layers operates to substantially reduce the biasing voltage.

9. The method of claim 6 wherein the device is a heterobarrier varactor; and wherein the first of the pair of the stacked layers has a total polarization that is substantially equal to the total polarization of the second of the pair of stacked layers and wherein each of the stacked layers further comprises a barrier layer therebetween.

10. The method of claim 6 wherein the N-polar and Group III-polar stacked layers each comprises at least two Group III-nitride layers having a barrier layer therebetween; whereby the pair of stacked layers operate to store electrical energy.

11. The method of claim 10 wherein the pair of stacked layers are epitaxially grown on a substrate and wherein the Group III-nitride layers comprise Galium Nitride and wherein the barrier layer comprises AlGaN.

12. The method of claim 11 wherein the Galium Nitride layers are substantially undoped.

13. The device of claim 6 wherein the Group III-N layers are at least approximately 5 nm thick and wherein the barrier layer is a Group III-N layer that is in the range of approximately 3 nm to 40 nm thick depending on exact material composition to minimize strain due to lattice mismatch during growth.

14. The method of claim 6 wherein the total polarization direction of the first of the pair of stacked layers is opposite to the total polarization direction of the second of the pair of stacked layers; and wherein the step of operatively connecting the pair of stacked layers comprises providing at least one contact configured to connect the pair of stacked layers such one of the contacts interconnects the Group III-polar face of the first of the pair of stacked layers with the N-polar of the second of the pair.

15. A method of making an electronic device comprising the following steps, not necessarily in the following order:
providing a substrate;
providing first and second stacks of polar semiconductor materials selected from the group of compounds consisting of GaN, InN, AlN, $Al_xGa_{(1-x)}N$, $In_xGa_{(1-x)}N$, $Al_xIn_{(1-x)}N$, $Al_xIn_yGa_{(1-x-y)}N$, where the values of x and y are greater than zero and less than one and wherein the sum of x and y is less than one, which create a polarization charge by one or more of spontaneous and piezoelectric polarization; the spontaneous and/or piezoelectric polarization charges being attributable to the atomic structure of the semiconductor materials, the first stack being Group III polar and the second stack being N-polar;
the first stack being positioned relative to the second stack such that the total spontaneous and/or piezoelectric polarization charge of the first stack is in a direction opposite to the total spontaneous and/or piezoelectric polarization charge of the second stack.

16. The method of claim 15 wherein the device is one of a varactor, frequency multiplier, pulse shaper, frequency filter, and oscillator; and wherein each stack has a total polarization that is substantially balanced by the total polarization charge of the other stack, and wherein each stack comprises semiconductor layers comprising a narrow energy gap material and a barrier layer comprising a wide energy gap material.

17. The method of claim 15 wherein the first and second stacks are spaced apart from each other and interconnected by at least one electrical connector;
the N-polar and Group III polar stacks each comprising at least two Group III N layers having a barrier layer therebetween;
and wherein the spontaneous polarization is attributable to the arrangement of atoms within the Group III-polar and N-polar layers in a wurtzite crystal lattice structure, the Group III polar surface consisting of Group III-atoms, the N-polar surface consisting of nitrogen atoms, and wherein the piezoelectric polarization is attributable to the differences in atom spacing within lattices of different Group III-N semiconductor layers;
whereby the N-polar and Group III polar stacks operate to store electrical energy and the at least one electrical connector provides for release of the electrical energy.

18. The method of claim 15 wherein the first and second stacks each contain narrow energy gap $Al_xIn_yGa_{(1-x-y)}N$ layers with a wide energy gap $Al_uIn_vGa_{(1-u-v)}N$ layer in between wherein the positions of the atoms within the crystal lattice are such that polarization direction of one structure is equal and opposite to that of the other, and wherein the values of u and v are greater than zero and less than one and wherein the sum of u and v is less than one.

19. The method of claim 17 wherein the first and second stacks are epitaxially grown on a substrate; wherein the Group III-N layers comprise Gallium Nitride and the barrier layer comprises AlGaN; and wherein the stacks configured to eliminate the need for a biasing voltage due to the total spontaneous and/or piezoelectric polarization charge of the first stack being in a direction opposite to the total spontaneous and/or piezoelectric polarization charge of the second stack.

20. The method of claim 17 wherein the Group III-N layers are at least approximately 5 nm thick and wherein the barrier layer is a Group III-N layer that is in the range of approximately 3 nm to 40 nm thick depending on exact material composition to minimize strain due to lattice mismatch during growth; and wherein the first and second stacks are spaced apart by a distance in the range of approximately 5 nm to 2 centimeters and wherein the stacks are passivated with SiN or $SiO_2$ or $Ga_2O_3$ or other materials that passivate group III-Nitride materials.

* * * * *